United States Patent [19]
Glezer et al.

[11] Patent Number: 6,056,204
[45] Date of Patent: *May 2, 2000

[54] SYNTHETIC JET ACTUATORS FOR MIXING APPLICATIONS

[75] Inventors: Ari Glezer, Atlanta; John W. Wiltse, Marietta, both of Ga.

[73] Assignee: Georgia Tech Research Corporation, Atlanta, Ga.

[*] Notice: This patent is subject to a terminal disclaimer.

[21] Appl. No.: 08/869,587

[22] Filed: Jun. 5, 1997

Related U.S. Application Data

[63] Continuation of application No. 08/489,490, Jun. 12, 1995, Pat. No. 5,758,823.

[51] Int. Cl.$^7$ ........................................................ B05B 17/04
[52] U.S. Cl. ................................ 239/8; 239/101; 239/434
[58] Field of Search .................................. 417/413.2, 560, 417/480, 479; 239/8, 101, 434, 102.1, 4

[56] References Cited

U.S. PATENT DOCUMENTS

| | | | |
|---|---|---|---|
| 1,485,715 | 3/1924 | Robinson | 239/423 |
| 1,878,088 | 9/1932 | Zwikker . | |
| 2,498,990 | 2/1950 | Fryklung | 259/72 |
| 2,591,083 | 4/1952 | Maier | 51/2 |
| 2,761,833 | 9/1956 | Ward | 222/212 |
| 2,812,636 | 11/1957 | Kadosch | 239/265.23 X |
| 3,058,014 | 10/1962 | Camp | 310/8.7 |
| 3,262,658 | 7/1966 | Reilly | 244/42 |
| 3,361,067 | 1/1968 | Webb | 103/1 |
| 3,425,058 | 1/1969 | Babington | 239/434 X |
| 3,985,344 | 10/1976 | McCord | 259/1 |
| 4,131,505 | 12/1978 | Davis, Jr. | 156/580.1 |
| 4,171,852 | 10/1979 | Haentjens | 406/85 |
| 4,206,831 | 6/1980 | Welch et al. | 181/159 |
| 4,363,991 | 12/1982 | Edelman | 310/316 |

(List continued on next page.)

FOREIGN PATENT DOCUMENTS

| | | |
|---|---|---|
| 3320481 | 12/1984 | Germany . |
| 4-103494 | 11/1967 | Japan . |
| 590503 | 11/1974 | U.S.S.R. . |

OTHER PUBLICATIONS

AIAA–97–2326; Effects of Zero–Mass "Synthetic" Jets On The Aerodynamics Of The NACA–0012 Airfoil; Ahmed A. Hassan and Ram D. JanakiRam; 1997.

Ingard, et al., "Acoustic Nonlinearity of an Orifice," The Journal of the Acoustical Society of America, vol. 42, No. 1, 1967, pp. 6–17.

Mednikov, et al., "Experimental study of intense acoustic streaming," Sov. Phys. Acoust., vol. 21, No. 2, Mar.–Apr. 1975, pp. 152–154.

Williams, et al., "The Mechanism of Flow Control on A Cylinder with the Unsteady Bleed Technique," AIAA 91–0039, Jan. 7–10, 1991.

Coe, et al., "Micromachined Jets for Manipulation of Macro Flows," 1994 Solid–State Sensor and Actuator Workshop, Hilton Head, SC.

*Primary Examiner*—Kevin Weldon
*Attorney, Agent, or Firm*—Thomas, Kayden, Horstemeyer & Risley

[57] ABSTRACT

The first preferred embodiment of an improved fluid mixing system comprises a synthetic jet actuator aligned perpendicular to a primary fluid flow. When the synthetic jet actuator is driven at a very high frequency, small scale mixing of the primary fluid flow can be effectively controlled. A second preferred embodiment for a mixing system comprises at least one synthetic jet actuator attached to the housing of a primary jet such that the direction of the synthetic jet flow will be parallel to the direction of the primary jet flow. If the two jets are allowed to operate at the same time, the synthetic jet actuator will have the effect of more effectively mixing the primary jet into the ambient fluid. Another embodiment of an improved mixing system comprises a synthetic jet actuator situated in a closed volume. The fluid flow created by the synthetic jet actuator in the closed volume will greatly aid mixing of the fluids in the chamber without injecting any new matter into the chamber.

10 Claims, 11 Drawing Sheets

U.S. PATENT DOCUMENTS

| | | | |
|---|---|---|---|
| 4,369,857 | 1/1983 | Frazzer et al. | 181/159 |
| 4,473,185 | 9/1984 | Peterson et al. | 239/8 |
| 4,516,747 | 5/1985 | Lurz | 244/204 |
| 4,533,082 | 8/1985 | Maehara et al. | 239/102 |
| 4,533,255 | 8/1985 | Gronholz et al. | 366/108 |
| 4,548,240 | 10/1985 | Graham | 138/30 |
| 4,611,553 | 9/1986 | Iwata et al. | 118/50 |
| 4,635,749 | 1/1987 | Tattersall | 181/152 |
| 4,646,945 | 3/1987 | Stiener et al. | 222/213 X |
| 4,697,769 | 10/1987 | Blackwelder et al. | 244/199 |
| 4,702,418 | 10/1987 | Carter et al. | 239/101 |
| 4,747,523 | 5/1988 | Dobbs et al. | 222/383 |
| 4,802,642 | 2/1989 | Mangiarotty | 244/200 |
| 5,040,560 | 8/1991 | Glezer et al. | 137/13 |
| 5,119,840 | 6/1992 | Shibata | 134/184 |
| 5,199,856 | 4/1993 | Epstein et al. | 417/312 |
| 5,203,362 | 4/1993 | Shibata | 134/194 |
| 5,238,153 | 8/1993 | Castillo et al. | 222/189 |
| 5,346,745 | 9/1994 | Bandyopadhyay | 428/156 |
| 5,365,490 | 11/1994 | Katz | 367/1 |
| 5,395,592 | 3/1995 | Bolleman et al. | 422/128 |
| 5,403,617 | 4/1995 | Haaland | 239/101 X |
| 5,411,208 | 5/1995 | Burgener | 239/8 |
| 5,582,348 | 12/1996 | Erickson | 239/8 X |
| 5,758,823 | 6/1998 | Glezer et al. | 239/4 |
| 5,791,601 | 8/1998 | Dancila et al. | 244/207 |

SYNTHETIC JET ACTUATORS FOR MIXING APPLICATIONS

RELATED APPLICATIONS

This application is a continuation of application Ser. No. 08/489,490, filed on Jun. 12, 1995 now U.S. Pat. No. 5,758,823.

FIELD OF THE INVENTION

The present invention generally relates to fluid actuators for manipulation and control of fluid flow and, more particularly, to a fluid actuator in the form of a synthetic jet actuator for mixing fluids through the introduction of small scale perturbations into a flow field and direct control of the small scale mixing.

BACKGROUND OF THE INVENTION

The ability to manipulate and control the evolution of shear flows has tremendous potential for influencing system performance in diverse technological applications, including: mixing and combustion processes, lift and drag of aerodynamic surfaces, and thrust management. That these flows are dominated by the dynamics of a hierarchy of vortical structures, evolving as a result of inherent hydrodynamic instabilities (e.g., Ho & Huerre, 1984), suggests control strategies based on manipulation of these instabilities by the introduction of small disturbances at the flow boundary. A given shear flow is typically extremely receptive to disturbances within a limited frequency band and, as a result, these disturbances are rapidly amplified and can lead to substantial modification of the base flow and the performance of the system in which it is employed.

There is no question, that suitable actuators having fast dynamic response and relatively low power consumption are the foundation of any scheme for the manipulation and control of shear flows. Most frequently, actuators have had mechanically moving parts which come in direct contact with the flow [e.g., vibrating ribbons (Schubauer & Skramstad *J. Aero Sci.* 14 1947), movable flaps (Oster & Wygnanski, 1982), or electromagnetic elements (Betzig *AIAA,* 1981)]. This class of direct-contact actuators also includes piezoelectric actuators, the effectiveness of which has been demonstrated in flat plate boundary layers (Wehrmann 1967, and Jacobson & Reynolds *Stan. U. TF*-64 1995), wakes (Wehrmann *Phys. Fl.* 8 1965, 1967, and Berger *Phys. Fl.* S191 1967), and jets (Wiltse & Glezer 1993). Actuation can also be effected indirectly (and, in principle, remotely) either through pressure fluctuations [e.g., acoustic excitation (Crow & Champagne *JFM* 48 1971)] or body forces [e.g., heating (Liepmann et al. 1982, Corke & Mangano *JFM* 209 1989, Nygaard and Glezer 1991), or electromagnetically (Brown and Nosenchuck, *AIAA* 1995)].

Flow control strategies that are accomplished without direct contact between the actuator and the embedding flow are extremely attractive because the actuators can be conformally and nonintrusively mounted on or below the flow boundary (and thus can be better protected than conventional mechanical actuators). However, unless these actuators can be placed near points of receptivity within the flow, their effectiveness degrades substantially with decreasing power input. This shortcoming can be overcome by using fluidic actuators where control is effected intrusively using flow injection (jets) or suction at the boundary. Although these actuators are inherently intrusive, they share most of the attributes of indirect actuators in that they can be placed within the flow boundary and require only an orifice to communicate with the external flow. Fluidic actuators that perform a variety of "analog" (e.g., proportional fluidic amplifier) and "digital" (e.g., flip-flop) throttling and control functions without moving mechanical parts by using control jets to affect a primary jet within an enclosed cavity have been studied since the late 1950's (Joyce, *HDL-SR* 1983). Some of these concepts have also been used in open flow systems. Viets (*AIAA J.* 13 1975) induced spontaneous oscillations in a free rectangular jet by exploiting the concept of a flip-flop actuator and more recently, Raman and Cornelius (*AIAA J.* 33 1995) used two such jets to impose time harmonic oscillations in a larger jet by direct impingement.

More recently, a number of workers have recognized the potential for MEMS (micro eclectro mechanical systems) actuators in flow control applications for large scale systems and have exploited these devices in a variety of configurations. One of a number of examples of work in this area is that of Ho and his co-investigators (e.g., Liu, Tsao, Tai, and Ho, 1994) who have used MEMS versions of 'flaps' to effect flow control. These investigators have opted to modify the distribution of streamwise vorticity on a delta wing and thus the aerodynamic rolling moment about the longitudinal axis of the aircraft.

Background Technology for Synthetic Jets

It was discovered at least as early as 1950 that if one uses a chamber bounded on one end by an acoustic wave generating device and bounded on the other end by a rigid wall with a small orifice, that when acoustic waves are emitted at high enough frequency and amplitude from the generator, a jet of air that emanates from the orifice outward from the chamber can be produced. See, for example, Ingard and Labate, *Acoustic Circulation Effects and the Nonlinear Impedance of Orifices,* The Journal of the Acoustical Society of America, March, 1950. The jet is comprised of a train of vortical air puffs that are formed at the orifice at the generator's frequency.

The concern of scientists at that time was only with the relationship between the impedance of the orifice and the "circulation" (i.e., the vortical puffs, or vortex rings) created at the orifice. There was no suggestion to combine or operate the apparatus with another fluid stream in order to modify the flow of that stream (e.g., its direction). Furthermore, there was no suggestion that following the ejection of each vortical puff, a momentary air stream of "make up" air of equal mass is drawn back into the chamber and that, as a result, the jet is effectively synthesized from the air outside of the chamber and the net mass flux out of the chamber is zero. There was also no suggestion that such an apparatus could be used in such a way as to create a fluid flow within a bounded (or sealed) volume.

Such uses and combinations were not only not suggested at that time, but also have not been suggested by any of the ensuing work in the art. So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

Vectoring of a Fluid Flow

Until now, the direction of a fluid jet has chiefly been controlled by mechanical apparatus which protrude into a jet flow and deflect it in a desired direction. For example, aircraft engines often use mechanical protrusions disposed in jet exhaust in order to vector the fluid flow out of the exhaust nozzle. These mechanical protrusions used to vector flow usually require complex and powerful actuators to move them. Such machinery often exceeds space constraints and often has a prohibitively high weight. Furthermore, in cases like that of jet exhaust, the mechanism protruding into the flow must withstand very high temperatures. In addition, large power inputs are generally required in order to intrude into the flow and change its direction. For all these reasons, it would be more desirable to vector the flow with little or no direct intrusion into the flow. As a result, several less intrusive means have been developed.

Jet vectoring can be achieved without active actuation using coanda effect, or the attachment of a jet to a curved (solid) surface which is an extension one of the nozzle walls (Newman, B. G. "The Deflexion of Plane Jets by Adjacent Boundaries-Coanda Effect," *Boundary Layer and Flow Control* v. 1, 1961 edited by Lachmann, G. V. pp. 232–265.). However, for a given jet momentum, the effect is apparently limited by the characteristic radius of the curved surface. The effectiveness of a coanda surface can be enhanced using a counter current flow between an external coanda surface and a primary jet. Such a system has been used to effect thrust vectoring in low-speed and high-speed jets by Strykowski et al. (Strykowski, P. J, Krothapalli, A., and Forliti D. J. "Counterflow Thrust Vectoring of Supersonic Jets," AIAA Paper No. 96-0115, AIAA 34th Aerospace Sciences Meeting, Reno, Nev., 1996.).

The performance of coanda-like surfaces for deflection of jets can be further improved by exploiting inherent instabilities at the edges of the jet flow when it is separated from the surface. It has been known for a number of years that substantial modification of shear flows can result from the introduction of small perturbations at the boundaries of the shear flow. This modification occurs because the shear flow is typically hydrodynamically unstable to these perturbations. Such instability is what leads to the perturbations' rapid amplification and resultant relatively large effect on the flow. This approach has been used in attempts to control separating flows near solid surfaces. the flow typically separates in the form of a free shear layer and it has been shown that the application of relatively small disturbances near the point of separation can lead to enhanced entrainment of ambient fluid into the layer. Because a solid surface substantially restricts entrainment of ambient fluid, the separated flow moves closer to the surface and ultimately can reattach to the surface. This effect has been used as a means of vectoring jets near solid surfaces. See e.g., Koch (Koch, C. R. "Closed Loop Control of a Round Jet/Diffuser in Transitory Stall," PhD. Thesis, Stanford University, 1990) (using wall jets along in a circular diffuser to effect partial attachment and thus vectoring of a primary round jet).

Similar to mechanical deflectors, technologies that rely on coanda surfaces are limited because of the size and weight of the additional hardware. Clearly, a coanda collar in aerospace applications must be carried along at all times whether or not it is being used.

Fluidic technology based on jet-jet interaction has also been used for flow vectoring or producing oscillations of free jets. Fluidic actuators employing control jets to affect a primary jet of the same fluid within an enclosure that allows for inflow and outflow have been studied since the late 1950's. These actuators perform a variety of "analog" (e.g., proportional fluidic amplifier) and "digital" (e.g., flip-flop) throttling and control functions in flow systems without moving mechanical parts (Joyce, 1983). In the "analog" actuator, the volume flow rate fraction of two opposite control jets leads to a proportional change in the volume flow rate of the primary stream out of two corresponding output ports. The "digital" actuator is a bistable flow device in which the control jets and Coanda effect are used to direct the primary stream into one of two output ports.

These approaches have also been employed in free jets. Viets (1975) induced spontaneous oscillations in a free rectangular jet by exploiting the concept of a "flip-flop" actuator. More recently, Raman and Cornelius (1995) used two such jets to impose time harmonic oscillations in a larger jet by direct impingement. The control jets were placed on opposite sides of the primary jet and could be operated in phase or out of phase with each other.

Use of a fluidic jet to vector another flow, while known for years, has been used with limited success. In particular, the only way known to vector a jet with another jet (dubbed a "control jet") of the same fluid was to align the control jet so that it impinges directly on the primary jet. Obviously, this involved injection of mass into the flow and has not been deemed very effective at vectoring the primary flow because it relies on direct momentum transfer between the jets for altering the direction of the primary jet. Direct momentum transfer is not economical in general and undesirable when the available power is limited (such as on board an aircraft). Furthermore, such control hardware is difficult and expensive to install because of the complex plumbing necessary to supply the control jet with fluid to operate.

Modification of Fluid Flows About Aerodynamic Surfaces

The capability to alter the aerodynamic performance of a given airframe by altering its shape (e.g., the "camber" of an airfoil) during various phases of the flight can lead to significant extension of the airframe's operating envelope. Geometric modification of lifting surfaces has so far been accomplished by using mechanical flaps and slats. However, because of the complex control system required, such devices are expensive to manufacture, install and maintain. Furthermore, flap systems not only increase the weight of the airframe, but also require considerable interior storage space that could be used for cargo, and additional ancillary hardware (e.g., hydraulic pumps, piping, etc.). In some applications, the weight penalty imposed by the flaps may more than offset their usefulness.

In addition to the use of mechanical flaps, there has been considerable effort to enhance the aerodynamic performance of lifting surfaces by delaying flow separation and thus the loss of lift and increase in drag. Conventional methods for such flow control have primarily focused on delay of separation or inducement of reattachment by introducing small disturbances into the upstream wall boundary layer. Excitation methods have included external and internal acoustic excitation (Huang, Maestrello & Bryant, *Expt. Fl.* 15 1987), vibrating flaps (e.g., Neuberger & Wygnanski, *USAF A TR*-88 1987) and unsteady bleeding or blowing (e.g., Sigurdson & Roshko, *AIAA* 1985, and Seifert, Bachar, Koss, Shepshelovich & Wygnanski, *AIAA J.* 31 1993). These methods have been used with varying degrees of success. The effectiveness largely depends on the receptivity of the boundary layer to excitation within a relatively narrow bandwidth.

Other efforts of designers to modify the flow about an aerodynamic surface have centered on injection of energy into the boundary layer of the flow in order to augment lift, reduce drag, delay turbulent onset, and/or delay flow separation. For example, the method disclosed by U.S. Pat. No. 4,802,642 to Mangiarotty involves the retardation of a flow's transition to turbulence. However, this prior art does not and cannot change the effective aerodynamic shape of the airfoil. That is, the apparatus cannot change the direction of flow of the free stream fluid about the surface. Instead, the apparatus propagates acoustic excitation above the Tollmien-Schlichting frequency in an attempt to disrupt Tollmien-Schlichting waves as they begin to form and thereby delay the onset of turbulence. Although this method changes the drag characteristic of a lifting surface, the mean velocity field and thus apparent aerodynamic shape of the surface remain unchanged.

Such devices as slots and fluid jets have also been extensively employed to inject energy into the boundary layer in order to prevent flow separation. Recently, efforts have turned to the use of piezoelectric or other actuators to energize the boundary layer along an aerodynamic surface. See, e.g., U.S. Pat. No. 4,363,991 to Edleman. These techniques, which employ acoustic excitation, change the surface aerodynamic performance by suppressing the naturally occurring boundary layer separation. This method requires the flow state to be vulnerable to specific disturbance frequencies. Although effective at delaying flow separation, none of these devices alter the apparent aerodynamic shape or mean velocity field of a given aerodynamic surface. Even though the changes in lift and drag that are caused by separation can be somewhat restored, there is no effect before separation occurs and the locus of the stagnation points remain largely unchanged. Therefore, before the present invention, there was no way to alter the effective shape of an aerodynamic surface without the complexity, high expense, and weight penalty of mechanical flaps or slats.

Mixing of Fluids at the Small Scale Level

In a somewhat different field of study, the ability to effectively control the evolution of the shear layer between two streams of similar fluids (gas or liquid) may have great impact on the mixing between the two streams (e.g., mixing a hot exhaust plume with cold ambient air). The boundary between the two streams forms the turbulent flow region known as a "shear layer." Hydrodynamic instabilities in this shear layer induce a hierarchy of vortical structures. Mixing between the two streams begins with the entrainment of irrational fluid from each stream by the large-scale vortical structures. These vortical structures scale with geometric features of the flow boundary (e.g., nozzle diameter of a jet, vortex generators, etc.) and they are critical to the mixing process between the two streams by bringing together in close contact volumes of fluid from each stream in a process that is referred to as entrainment. Layers of entrained fluid are continuously stretched and folded at decreasing scales by vortical structures that evolve through the action of shear and localized instabilities induced by larger vortical structures. This process continues until the smallest vortical scales are attained and fluid viscosity balances the inertial forces. This smallest vortical scale is referred to as the Kolmogorov scale. Thus, a long-held notion in turbulence is that the smallest and largest turbulent motions are indirectly coupled through a cascade of energy from the largest to successively smaller scales until the Kolmogorov scale is reached and viscous diffusion can occur. Turbulent dissipation is the process by which (near the Kolmogorov scale) turbulent kinetic energy is converted into heat as small fluid particles are deformed.

Scalar mixing (of heat or species, for example) is similar, but not identical to momentum mixing. Analogous to the Kolmogorov scale, the Batchelor scale is the smallest spatial scale at which an isoscalar particle can exist before scalar gradients are smoothed by the action of molecular diffusion. If scalar diffusion occurs on a faster scale than momentum diffusion, the Kolmogorov energy cascade breaks "packets" of scalars down into scales small enough that molecular scalar diffusion can occur (at the Batchelor scale). In this case, the Batchelor scale is larger than the Kolmogorov scale and turbulent motions persist at scales where scalar gradients have been smoothed out by diffusion. If, on the other hand, scalar diffusion occurs on a slower scale than momentum diffusion, turbulent motions stop (at the Kolmogorov scale) before the scalar gradients are smoothed out. Final mixing only occurs after laminar straining further reduces the size of the scalar layers.

There is a substantial body of literature that demonstrates that mixing in shear flows can be influenced by manipulating the evolution of the large scale eddies (vortical structures) within the flow. Because the large-scale eddies result from inherent hydrodynamic instabilities of the flow, they can be manipulated using either passive or active devices.

As noted above, although the entrainment process in turbulent shear flows is effected by the large-scale eddies, molecular mixing ultimately takes place at the smallest scales which is induced by a hierarchy of eddies of decreasing scales that continuously evolve from the largest scale eddies. Because the base flows are normally unstable at the large scales (and thus receptive to either passive or active control inputs), the traditional approach to controlling mixing at the small-scale has been indirect. Previous attempts to control small-scale mixing employing both passive and active control strategies have relied on manipulation of global two-and three-dimensional instability modes of the base flow with the objective of controlling mixing through the modification of the ensuing vortical structures.

Passive control has primarily relied on (permanent) modification of the geometry of the flow boundary. For example, mixing of jet exhaust is often enhanced by corrugating the exhaust port of a jet. This corrugation creates the appearance of a number of lobes defined by raised and recessed curves which induce counter-rotating vortices, thus promoting mixing in the direction of the exhaust flow. Other passive devices for the promotion of mixing have included small tabs that act as vortex generators. The disadvantage of such mixing devices is that their geometry is fixed and thus their effectiveness cannot be adjusted for varying flow conditions.

Conventional active control strategies overcome this deficiency because the control input can be adjusted. For example, one prior disclosure describes the manipulation of large scale eddies in a plane shear layer between two uniform streams using a small oscillating flap. However, because this approach depends on the classical cascading mechanism to transfer control influence to the scales at which molecular mixing occurs, mixing at the smallest scales in fully turbulent flows is only weakly coupled to the control input. More importantly, mixing control of this nature relies on a priori knowledge of the flow instabilities and associated eigenfrequencies of the particular flow. Specifically, this method also requires that the flow be unstable to a range of disturbances, a condition which is not always satisfied.

Clearly, more efficient control of mixing in fully turbulent shear flows might be achieved by direct (rather than hierarchical) control of both the large-scale entrainment and the small-scale mixing processes. Such a control method has, before now, not been available but is enabled by synthetic jet actuators that are the subject of the present disclosure. Earlier work has demonstrated two important attributes of direct small-scale excitation: (1) that small-scale eddies can indeed be influenced by direct excitation of discrete wavenumbers within the dissipation range of a free shear layer, and (2) that this strategy also allows for efficient control of the large scale eddies. In the work of Wiltse and Glezer (1994), shear layer segments of a square air jet are forced near the jet exit plane at frequencies within the dissipation range of the base flow by planar, bimorph, piezoelectric actuators driven at resonance. These small-scale motions can have wavenumbers within one to two orders of magnitude of the Kolmogorov wavenumber of the base flow, thus enabling one to induce scalar mixing directly at the small scales, without relying on the conventional energy cascade. The dynamics of the large-scale eddies (and thus the entrainment process) is influenced by amplitude modulation of the excitation waveform. The work of Wiltse Nygaard and Glezer clearly demonstrate that the flow demodulates the excitation waveform, thus allowing simultaneous excitation at high and low frequencies, and thus of small- and large-scales, respectively. However, in all the prior art methodologies, intrusion or mass addition into the flow is required. Additionally, such mixing control is often ineffective in a bounded volume.

Cooling of Heated Bodies

Cooling of heat-producing bodies is a concern in many different technologies. Particularly, a major challenge in the design and packaging of state-of-the-art integrated circuits in single- and multi-chip modules (MCMs) is the ever increasing demand for high power density heat dissipation. While current technologies that rely on global forced air cooling can dissipate about 4 $W/cm^2$, the projected industrial cooling requirements are 10 to 40 $W/cm^2$ and higher within the next five to ten years. Furthermore, current cooling technologies for applications involving high heat flux densities are often complicated, bulky and costly.

Traditionally, this need has been met by using forced convective cooling using fans which provide global overall cooling when what is often required in pinpoint cooling of a particular component or set of components. Furthermore, magnetic-motor-based fans have the problem of generating electromagnetic interference which can introduce noise into the system.

In applications when there is a heat-producing body in a bounded volume, the problem of cooling the body is substantial. In fact, effective cooling of heated bodies in closed volumes has also been a long standing problem for many designers. Generally, cooling by natural convection is the only method available since forced convection would require some net mass injection into the system, and subsequent collection of this mass. The only means of assistance would be some mechanical fan wholly internal to the volume. However, often this requires large moving parts in order to have any success in cooling the heated body. These large moving parts naturally require high power inputs. But, simply allowing natural convective cooling to carry heat from the body producing it into the fluid of the volume and then depending on the housing walls to absorb the heat and emit it outside the volume is a poor means of cooling.

SUMMARY OF THE INVENTION

Briefly described, the present invention involves the use of improved synthetic jet actuators in novel mixing applications. Particularly, the present invention is concerned with a radically new approach to mixing control, based on concurrent manipulation of both the small- and large-scale vortical structures in a turbulent shear flow by means of a synthetic jet actuator.

A first object of the present invention is to provide an improved device for asserting indirect, non-intrusive control over the mixing of a fluid flow. Most of the previous approaches to flow control can be classified as direct contact actuators. That is, prior art actuators generally have mechanically moving parts that come into direct contact with the flow in order to effect control authority. In contrast to these approaches, the fluidic technology based on synthetic jet actuators, which is the subject of the present invention, allows indirect assertion of control authority.

Another object of the present invention is for producing a synthetic jet of fluid synthesized from the working fluid of the medium where the synthetic jet actuator is deployed. Thus, linear momentum is transferred to the flow system without net mass injection into the system.

Another object of the present invention is for direct control over both the large scale and small scale mixing processes within a fluid. As mentioned in the introduction, while entrainment of irrotational fluid in turbulent shear flows is effected by large-scale motions, molecular mixing ultimately takes place of the smallest scales. In most shear flows this mixing is normally induced by a hierarchy of vortical structures of decreasing scales, which ensue from hydrodynamic instabilities of the flow. The traditional approach to the control of mixing at the small scales has been indirect and has relied on the manipulation of global two-and-three-dimensional instability modes that lead to the appearance of large scale vortical structures. These vortices ultimately break down to smaller and smaller scale vortices in what is referred to as a cascading process and induces smaller and smaller scale motions that lead to molecular mixing. Because the traditional approach to mixing depends on this cascading mechanism to transfer control influence to the scales at which moleculars mixing occurs, the mixing at the smallest scales is only weakly coupled to the control input.

Fluidic actuation using synthetic jets allows for exploitation of nonlinear mechanisms for amplification of disturbances in a very broad frequency band, and thus allows for a new approach to the control and enhancement of mixing in shear flows through small-scale vorticity. Small-scales that are within the dissipation range of the driven flow can be excited by adjusting the scale of the vortices that synthesize the synthetic jets, through the characteristic dimension of the orifice and the period of oscillations of the jet diaphragm. Thus mixing can be directly influenced at the scales in which it actually occurs within the driven flow. Large bandwidth is attainable using amplitude and frequency modulation of the resonant carrier frequency of these actuators.

Another important attribute of the synthetic jet approach is that it enables the creation of a flow within a bounded volume. Particularly, effective mixing of fluids inside a bounded volume could be achieved without the addition of new species, need for a fluid source or drain, and without a mechanical stirring device, which may require a large power input and place additional geometric or contamination constraints on the designer. Some common applications of mixing in a bounded volume are mixing in chemical lasers and mixing for chemical or pharmaceutical products. In addition to these fields, the development of methods for enhancement of mixing through manipulation of the flow in which it occurs will have a direct impact on the performance of various other technologically important systems (e.g., propulsion, combustion, or in bio-engineering).

I. Construction and Operation of Synthetic Jets

The construction and operation of various synthetic jet actuators will first be described. These jets serve as the "hardware" for the present invention and are described in detail in patent application Ser. No. 08/489,490. After discussing these devices, generally, several preferred embodiments of mixing apparatuses using synthetic jet actuators will be discussed.

A. First Preferred Embodiment of a Synthetic Jet Actuator

A first preferred embodiment of a synthetic jet actuator comprises a housing defining an internal chamber. An orifice is present in a wall of the housing. The actuator further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. The flexible diaphragm may be actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves outward with respect to the chamber, increasing the chamber volume, ambient fluid is drawn through the orifice into the chamber. Since the vortices are already removed from the edges of the orifice, they are not affected by the ambient fluid being entrained into the chamber. As the vortices travel away from the orifice, they synthesize a jet of fluid, a "synthetic jet," through entrainment of the ambient fluid.

In addition to the basic design of a synthetic jet actuator, one may modify the design to enhance performance. This enhanced synthetic jet actuator comprises a housing defining an interior chamber and an orifice in one wall of the housing. This synthetic jet actuator has a device or mechanism for withdrawing fluid into the chamber and for forcing fluid out of the chamber through the orifice. At least one louver is attached to the housing and is aligned with an opening formed in the housing. The louver is a one-way valve and only permits fluid flow in one direction. Thus, the louver permits fluid flow either into the chamber through the opening or out of the chamber through the opening.

The operation of the enhanced synthetic jet actuator can vary greatly depending upon whether the louver permits fluid to flow into the chamber or instead only permits fluid to flow out of the chamber. If the louver permits fluid flow into the chamber, then the synthetic jet actuator is able to withdraw fluid into the chamber through a greater surface area. The force of the jet formed by the synthetic jet actuator, however, is not decreased since all of the fluid exits the chamber through the orifice. The synthetic jet actuator with this configuration can operate at higher momentum during the outstroke. Alternatively, if the louver only permits fluid to flow out of the chamber, then the synthetic jet actuator will operate at higher momentum during the instroke.

A synthetic jet actuator may have any suitable louver and any suitable mechanism or device for withdrawing fluid into the chamber and for forcing fluid out of the chamber. For instance, the louver may be a passive louver or an active louver, such as one whose position is at least partially controlled by a piezoelectric material. The device or mechanism may comprise a piston reciprocating within the chamber or may comprise a flexible diaphragm driven by piezo-electric actuation.

B. Second Preferred Embodiment of a Synthetic Jet Actuator

The synthetic jet actuator just described is not the only device capable of forming a synthetic jet stream. Indeed, there are several ways to build a synthetic jet actuator for use with the present invention. For example, in certain applications a constant suction synthetic jet actuator may be desirable. In this preferred embodiment, a synthetic jet actuator will typically be embedded in a body and operate through the outer surface of the body. There may be no room in the body for a piston or other volume changing means suggested by the first preferred embodiment. This second preferred embodiment provides a solution to such a potential problem.

For the second preferred embodiment of a synthetic jet actuator, there are two concentric tubular sections, or pipes embedded in the solid body, normal to the outside surface. The outer of the two pipes is preferably connected to a source of fluid with a means for pulsing a fluid out of this pipe. The innermost of the two pipes is connected to an appropriate means for pulling fluid down this pipe from the ambient fluid above the planar surface, such as a vacuum or fluid pump. Situated such that its exit plane is slightly below the surface, in operation, the innermost pipe constantly pulls fluid down its length from the ambient fluid above the flat, planar surface. Meanwhile, the outer pipe is caused to pulse fluid into the ambient environment above the planar surface. Such an operation will cause a synthetic fluid jet to form above the constant suction synthetic jet actuator.

Additionally, this embodiment allows a user to tailor the net mass flux into the system caused by the synthetic jet actuator. The source of fluid could be a compressor or other source separate from the depository of the fluid drawn into the innermost pipe. One could, therefore, tailor the system to yield a net mass increase, decrease, or no net mass flux in the system above the synthetic jet actuator.

II. Applications and Advantages of Mixing with Synthetic Jet Actuators

The devices capable of forming synthetic jets, and the improvement of using louvers, all have certain features common to the class of synthetic jets, which permit more effective mixing of fluids and greater control over the mixing process. The present invention involves these new and advantageous mixing applications. A brief description of the novel apparatus and process to which the present invention is directed as follows.

A. Mixing with a Synthetic Jet Actuator in Free Fluid Flows

Synthetic jet interactions with other fluid streams can be used in mixing applications. Previously, mixing of primary fluid flows with ambient fluid required either net mass injection into the flow or physical intrusion into the flow. These methods were not only marginally effective, but they were usually expensive to install or difficult to maintain as well. However, use of synthetic jet actuators in mixing of free flows avoids the need to physically intrude into the flow and gives the user better control of mixing through direct small scale vortex manipulation.

In a first preferred embodiment of a fluid mixing system, a synthetic jet actuator is aligned perpendicular to a primary fluid flow. When the synthetic jet actuator is driven at a very high frequency, small scale mixing of the primary fluid flow can be effectively controlled. Furthermore, through amplitude modulation, simultaneous excitation of both small and large scales is possible. Small scale manipulation can be effected by synthetic jet actuators where the scale of perturbations induced by the synthetic jet actuator is adjusted to be within the dissipation range of the affected flow.

In fact, use of a synthetic jet actuator is not the only available method of perturbing the flow, but many methods of perturbation in a primary flow shear layer would yield similar results. While it is clear that direct excitation at the molecular scale is usually impractical with current technology, it is nonetheless possible to operate at the Kolmogorov scale or even considerably smaller. This enables one using some means of high frequency perturbation to induce mixing directly at the small scales without relying on the conventional energy cascade. This produces a vast improvement over the prior art in both control and effectiveness of mixing.

Additional advantages to this mixing enhancement technique are found in the fact that such high frequency excitation increases the dissipation of a primary flow's turbulent energy. This reduction in turbulent energy may lead to reduction in turbulent drag may be expected if this technique is applied in a boundary layer. In addition, this technique can be used to reduce noise caused by the large scale vortical structures in free shear flows.

Excitation of the flow at frequencies corresponding to the Batchelor scale will increase scalar dissipation (molecular mixing of scalar quantities, such as concentration or temperature) in much the same manner as excitation at the Kolmogorov frequency increases turbulent kinetic energy dissipation.

Aligning a synthetic jet actuator perpendicular to the primary fluid flow is not the only way for a synthetic jet actuator to enhance mixing of the primary flow with ambient fluid. In some potential applications, such as mixing jet engine exhaust with ambient fluid in order to better cool the exhaust, it may be desirable to vector a primary jet as well as enhance mixing of the flow.

In the most simple system for a "parallel" mixing apparatus, a synthetic control jet is attached to the top housing of a primary jet such that the direction of its flow will be parallel to the direction of the primary jet flow. If the two jets are allowed to operate at the same time, the synthetic jet actuator will have the effect of vectoring the primary jet. If the synthetic control jet orifice is near the exhaust plane of the primary jet, then the primary jet flow will be vectored toward the synthetic control jet. On the other hand, if the synthetic control jet orifice is a enough distance behind the exhaust plane of the primary jet, then the primary jet will be vectored away from the control jet due to the synthetic jet flow negotiating the ninety-degree turn at the end of the primary jet housing and directly impinging into the flow of the primary jet.

In this configuration, not only will the jet be vectored toward (or away from) the synthetic jet actuator but the primary jet fluid will also be more effectively mixed with the ambient fluid due to excitation of the large scale eddies in the flow. Vectoring with the much weaker synthetic jet actuator causes the primary jet to entrain much more ambient fluid into its stream. In fact, the primary jet flow rate can increase by 300% over the unvectored primary jet's flow rate. It is noteworthy that the difference in the flow rate between the forced and unforced primary jet flow is much larger than the flow rate of the synthetic control jet alone. In one application of this preferred embodiment, such entrainment of ambient fluid and the resultant mixing could easily help cool hot jet engine exhaust.

B. Mixing Fluids in a Bounded Volume with Synthetic Jet Actuators

In contrast to conventional jets, a unique feature of synthetic jet actuators is that they are normally synthesized from the working fluid of the flow system in which they are deployed. Therefore, synthetic jet actuators may be used to create fluid flows in bounded volumes, where conventional jets could never be used. In particular, synthetic jet actuators in bounded volumes are extremely effective in mixing the working fluid in the bounded volume. Although equally true in open flow systems, one should be reminded that synthetic jet actuators in closed systems do not need any complex piping to function and do not inject any fluid into the system. This is not to mention the low energy requirements and the fact that conventional jets are, by their very nature, unusable in bounded volume situations due to the necessity of fluid injection.

By use of a synthetic jet actuator in a closed volume, control of mixing can be enhanced through small-scale vorticity manipulation and reduction of contamination will be effected through use of a jet which injects no foreign matter into the environment. The fluid flow created by the jet will greatly aid mixing of the fluids in the chamber without injecting any new matter into the chamber. Furthermore, use of a synthetic jet actuator will enable greater control of the mixing due to excitation at the Kolmogorov scale.

Other features and advantages will become apparent to one with skill in the art upon examination of the following drawings and detailed description. All such additional features and advantages are intended to be included herein within the scope of the present invention, as is defined by the claims.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims.

As with the brief description above, the construction and operation of various synthetic jet actuators will first be described. These jets serve as the "hardware" for the present invention and are described in greater detail in patent application Ser. No. 08/489,940. After discussing these devices, generally, several preferred embodiments of mixing apparatuses using synthetic jet actuators will be discussed.

I. Synthetic Jet Actuator Hardware

A. First Preferred Embodiment

Figure 1A:
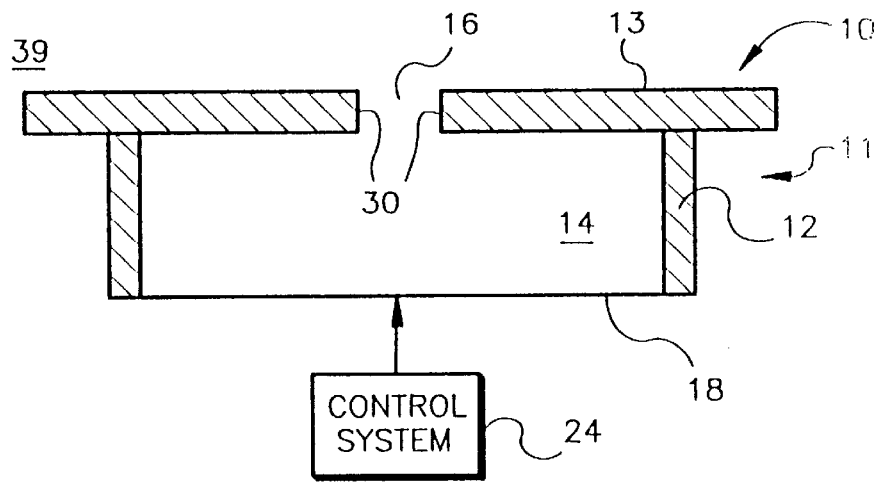
FIG. 1A is a schematic cross-sectional side view of a zero net mass flux synthetic jet actuator with a control system.

FIG. 1A depicts a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

Alternatively, a piezoelectric actuator could be attached to the diaphragm 18. The control system would, in that case, cause the piezoelectric actuator to vibrate and thereby move the diaphragm 18 in time-harmonic motion. The method of causing the diaphragm 18 to modulate is not limited by the present invention.

Figure 1B:
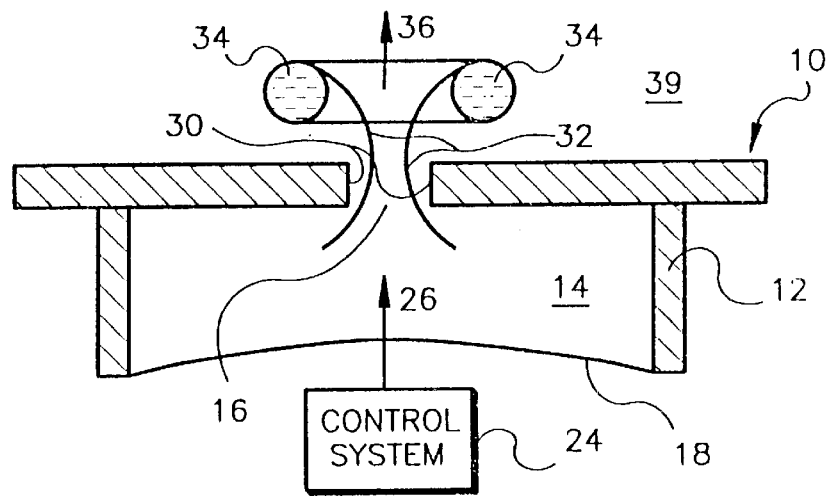
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
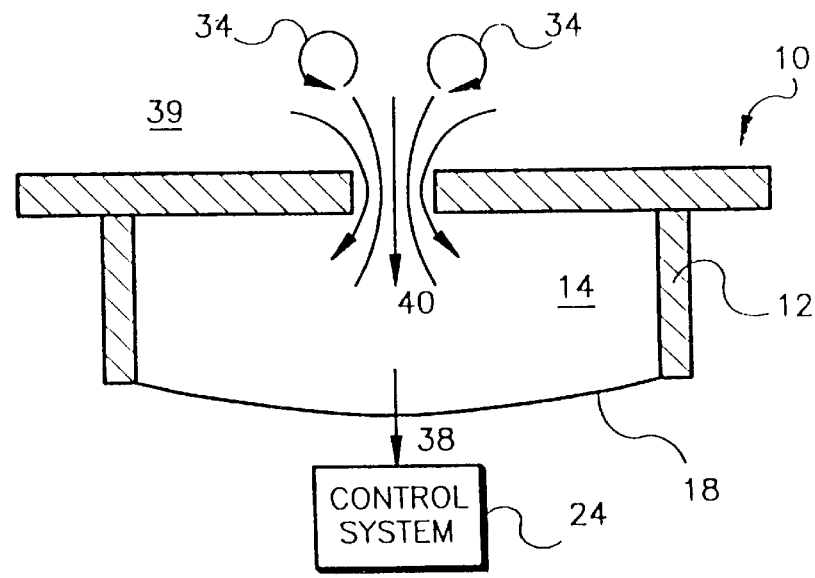
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

B. Modification of the First Preferred Embodiment

Synthetic Jets with Louvers

In the first preferred embodiment, the synthetic jet actuator 10 had a flexible diaphragm 18 for forcing fluid into and out of a chamber 14. The flexible diaphragm 18 is described as being controlled by a control system 24 which may comprise, inter alia, a processor or logic circuitry. The synthetic jet actuator, however, is not limited to the use of just a flexible diaphragm. For instance, in some applications, a moveable piston head may be preferred. In these applications, the piston head would be positioned within the chamber 14 opposite the orifice 16 and would be moved by any suitable mechanism, such as a piston rod, so as to reciprocate within the chamber 14.

As opposed to the flexible diaphragm 18, the piston head would be able to move a larger mass of fluid and thus be able to produce fluid flows having larger momentums. With these stronger fluid flows, the synthetic jet actuator 10 in turn may operate more effectively in vectoring primary fluid flows, in altering aerodynamic surfaces, in promoting mixing of fluids, and in aiding heat transfer to or from a fluid. The use of a piston rather than the flexible diaphragm 18 will have other advantages and benefits which will be apparent to those skilled in the art.

A synthetic jet actuator, such as actuator 10 shown in FIGS. 1A to 1C, can be modified to operate more efficiently at very high speeds. At a very high speed, after the fluid is forced out of the chamber 14 through the orifice 16, the diaphragm 18 or piston then quickly begins to move away from the orifice 16 and attempts to draw fluid back into the chamber 14. A limitation on the withdrawal of fluid back into the chamber 14 can decrease the force of the jet 36 and the effectiveness of the jet actuator 10. Furthermore, if the fluid is compressible, the quick retraction of the flexible diaphragm 18 creates a vacuum within the chamber 14. As a result, the fluid that is drawn into the chamber 14 has less mass than that previously forced out of the chamber 14 and the subsequent jet 36 will, consequently, have less momentum. The inability to force an adequate mass of fluid into the chamber 14 therefore decreases the effectiveness of the jet actuator 10.

Figure 4A:
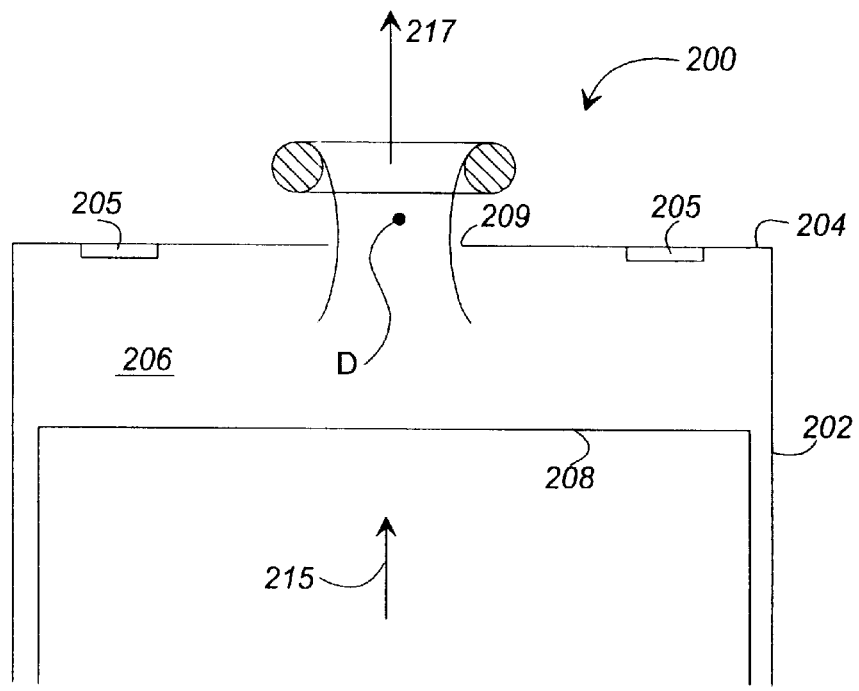
FIG. 4A is a schematic cross-sectional side view of a synthetic jet actuator having a pair of outwardly-opening louvers in a closed position while a piston moves toward an orifice.
Figure 4B:
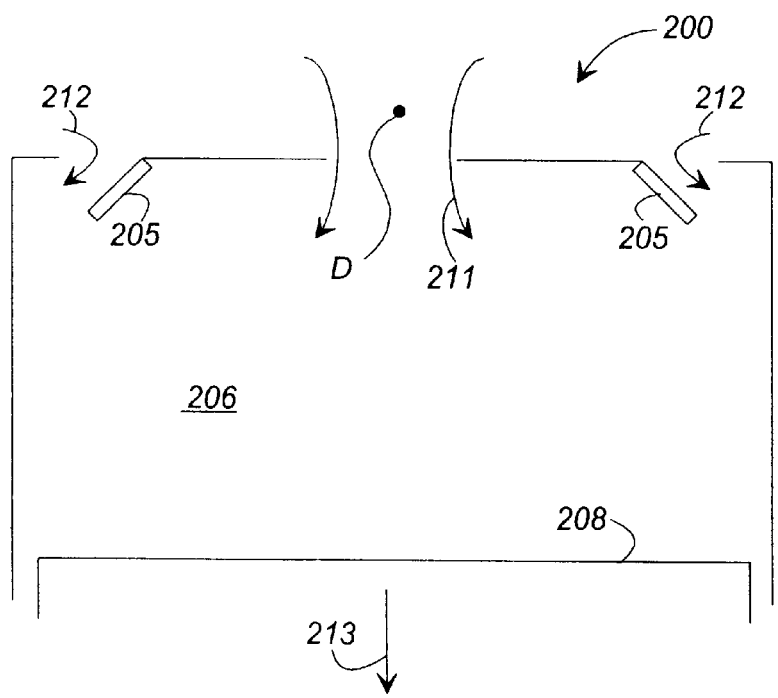
FIG. 4B is a schematic cross-sectional side view of the synthetic jet actuator of FIG. 4A illustrating the louvers in an open position while the piston moves away from the orifice.

A synthetic jet actuator 200 which can effectively operate at high speeds is shown in FIGS. 4A and 4B and comprises a housing 202 defining an interior chamber 206. The housing 202 has an upper wall 204 with an orifice 209 and at least one louver 205. In the preferred embodiment, the jet actuator 200 preferably has a plurality of louvers 205. Only two louvers 205 have been shown in the figures in order to simplify the description. The synthetic jet actuator 200 also comprises a piston head 208 for reciprocating toward and away from the orifice 209 at a prescribed rate and stroke distance. The invention is not limited to any particular stroke distance or rate whereby the rate and stroke distance may be adjusted according to the particular needs of an application.

FIG. 4A illustrates the jet actuator 200 at a time when the piston 208 is moving toward the orifice 209. As shown in the figure, the louvers 205 are in a closed position whereby a fluid flow 217 is forced out only through the orifice 209. The jet 217 produced by the jet actuator 200 is similar to the jet 36 produced by the jet actuator 10 and produces vortex sheets which roll into vortices and move away from the orifice 209.

With reference to FIG. 4B, the louvers 205 open during the time that the piston 208 moves away from the orifice 209. With the louvers 205 opened, fluid may enter the chamber 206 not only through the orifice 209 in flow 211 but also through the openings adjacent to the louvers 205 in flows 212. These additional fluid flows 212 substantially increase the surface area by which fluid may enter the jet actuator 200 and enable the jet actuator 200 to force a sufficient amount of fluid into the chamber 206 while the piston 208 moves away from the orifice 209. Since the jet actuator 200 is able to intake sufficient amounts of fluid within the chamber 206, the jet actuator 200 is able to maintain the momentum of the fluid flow 217 in subsequent strokes of the piston 208.

Figure 5A:
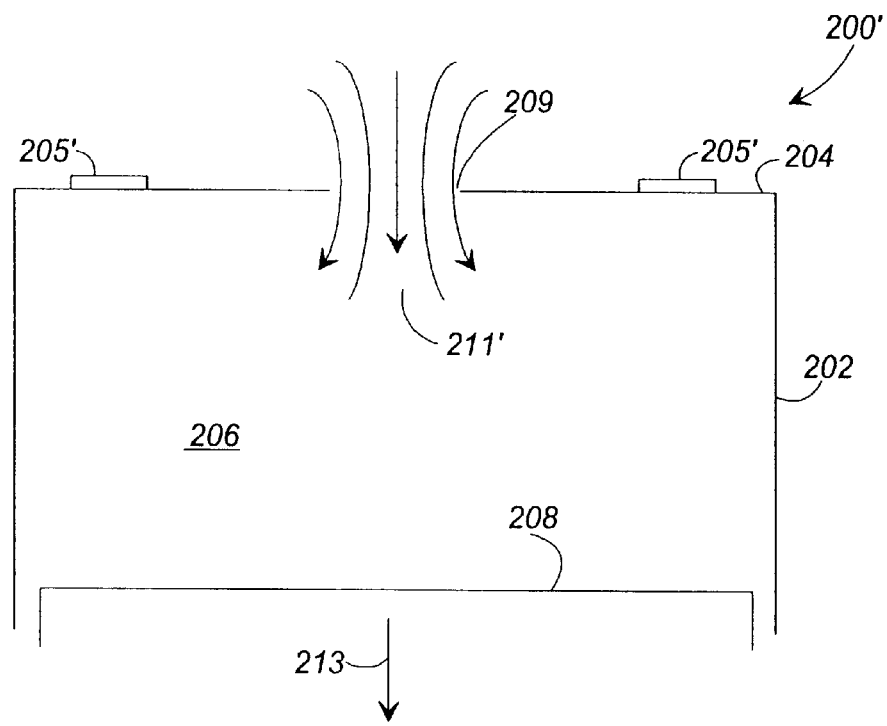
FIG. 5A is a schematic cross-sectional side view of a synthetic jet actuator having a pair of outwardly-opening louvers placed in a closed position while a piston moves away from an orifice.
Figure 5B:
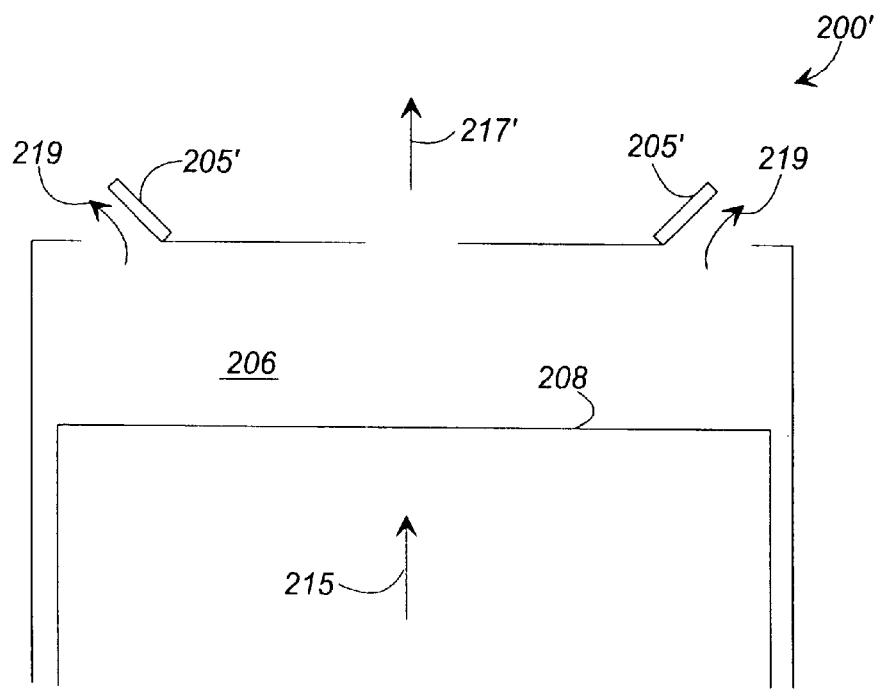
FIG. 5B is a schematic cross-sectional side view of the synthetic jet actuator of FIG. 5A illustrating the louvers in an open position while the piston moves toward the orifice.

In some applications, a fluid flow with larger momentum 211 into the chamber 206 of the jet actuator 200 and a smaller flow out of the orifice 209 may be desirable. FIGS. 5A and 5B illustrate a jet actuator 200' which has a plurality of louvers 205' which become opened while the piston 208 moves toward the orifice 209 and become closed while the piston 208 moves away from the orifice 209. As a result, during the down stroke of the piston 208, as shown in FIG. 5A, a large fluid flow 211' is forced through the orifice 209. During the up stroke of the piston 208, on the other hand, the louvers 205' become opened and fluid is permitted to exit the chamber 206 not only through orifice 209 in flow 217' but also through the openings adjacent louvers 205' in flows 219. Since the fluid has a greater surface area in which to exit the chamber 206, the momentum of the flow 217' is substantially decreased.

As should be apparent from FIGS. 4A, 4B, 5A, and 5B, the amount of fluid that is drawn into the chamber 206 or which is forced out of the chamber 206 may be altered by using one or more louvers. With the jet actuator 200, the louvers 205 increase the amount of fluid that enters the chamber 206 while the louvers 205' in jet actuator 200' decrease the momentum of the jet 217' exiting the orifice 209. By adjusting the size and number of the openings covered by the plurality of louvers, the flow rates in and out of the chamber 206 may be altered.

1. Alternate Types of Louvers

The louvers in a synthetic jet actuator are one-way valves that permit fluid flow in one direction but which block flow in the opposite direction. As shown above in synthetic jet actuators 200 and 200', the louvers can permit fluid flow either into the chamber 206 or out of the chamber 206. The invention can be implemented with any suitable type of louver, such as either an active louver or a passive louver. A passive louver is simply a flap or valve which is hinged so as to open with fluid flow in one direction and which closes tight against the housing 202 of the jet actuator with fluid flow in the opposite direction.

Figure 7A:
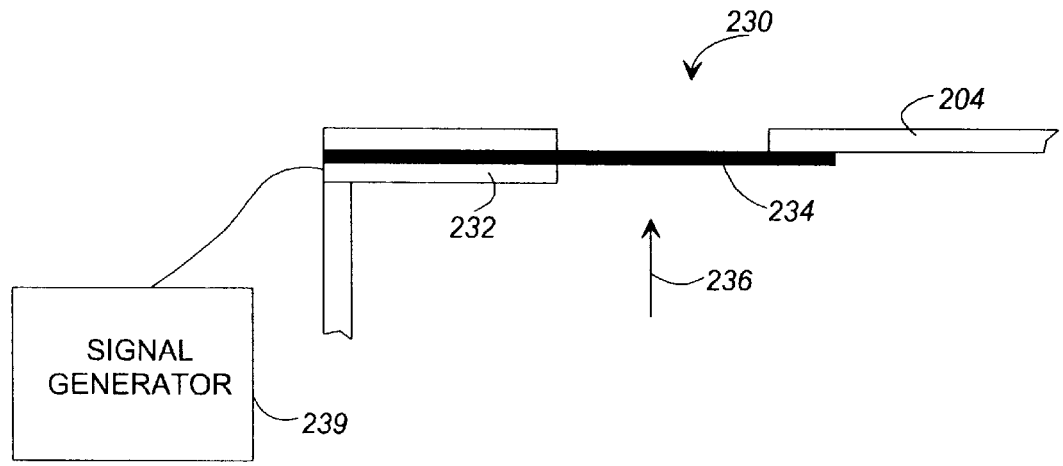
FIG. 7A is a schematic cross-sectional side view of an active louver in a closed position.
Figure 7B:
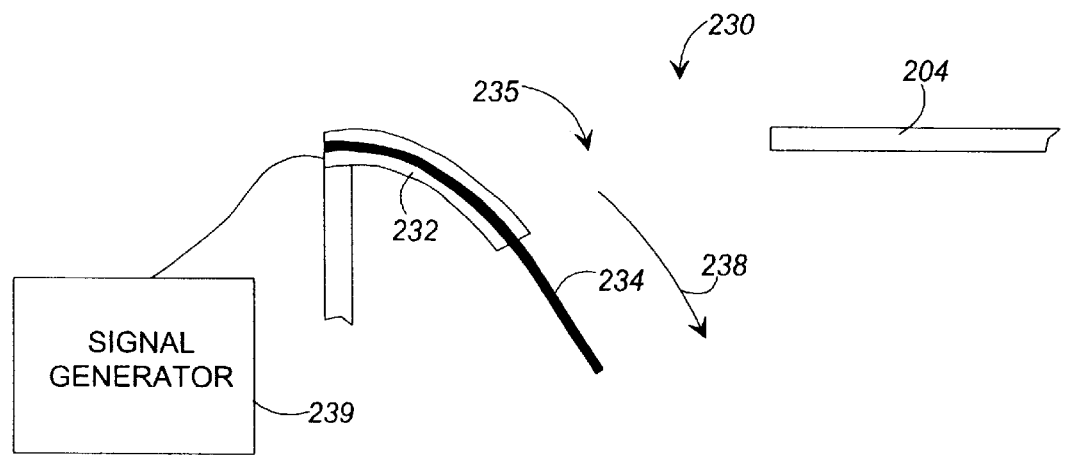
FIG. 7B is a schematic cross-sectional side view of the active louver of FIG. 7A in an open position.

An active louver, such as louver 230 shown in FIGS. 7A and 7B, becomes opened or closed with the assistance of a force other than just the force of a fluid flow. In the example shown in FIGS. 7A and 7B, this other force may be generated by a piezoelectric material 232. With reference to FIG. 7A, when the louver 230 is in a closed state, a semi-rigid member 234 is in intimate contact with wall 204 of the synthetic jet actuator. The semi-rigid member 234 preferably overlaps a portion of the wall 204 so that the louver 230 remains in a closed state even when a fluid flow 236 contacts the louver 230. As is known to those skilled in the art, the piezoelectric material 232 will deflect upon the application of an electrical signal. Thus, an electrical signal can be applied to the piezoelectric material 232 from a signal generator 239 to cause the piezoelectric material to deflect down to an open state shown in FIG. 7B. In the open state, a fluid flow 238 is permitted to travel through an opening 235 and exit the chamber or, as depicted in this example, enter the chamber. The exact manner in which an electrical signal is applied to the piezoelectric material 232 is known to those skilled in the art and, accordingly, has been omitted from the drawings in order to simplify the description of the invention.

2. Louvered Jet Actuator as a Pump

Figure 8A:
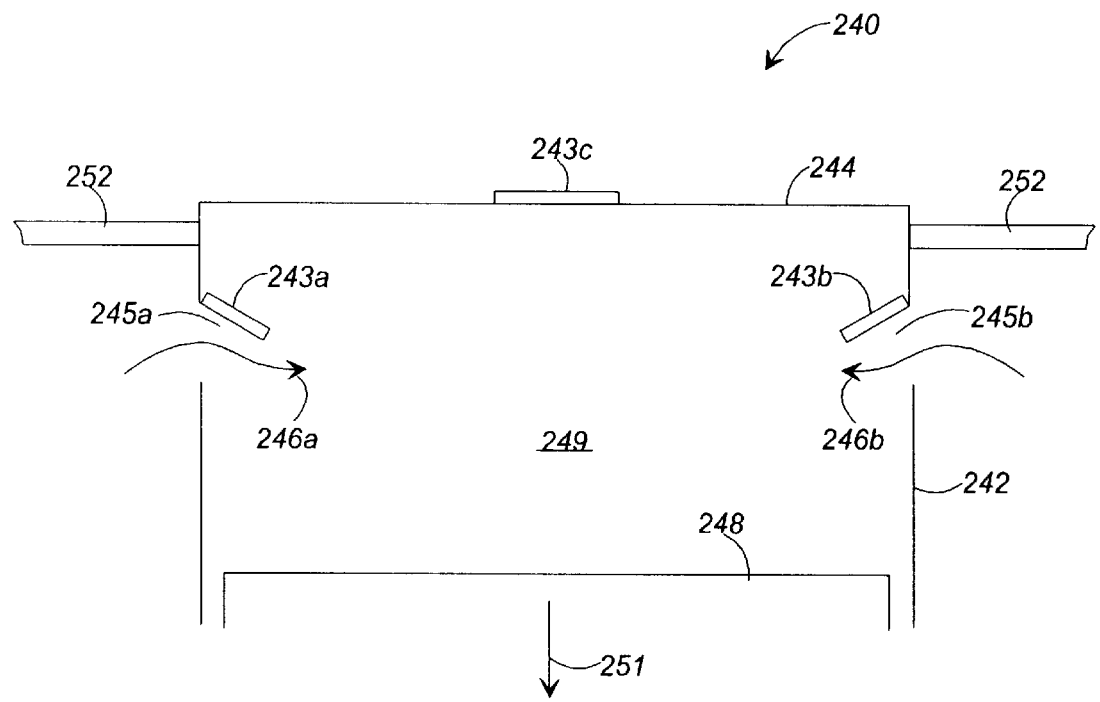
FIG. 8A is a schematic cross-sectional side view of a synthetic jet actuator which is used as a pump and illustrates a piston drawing fluid into the actuator.
Figure 8B:
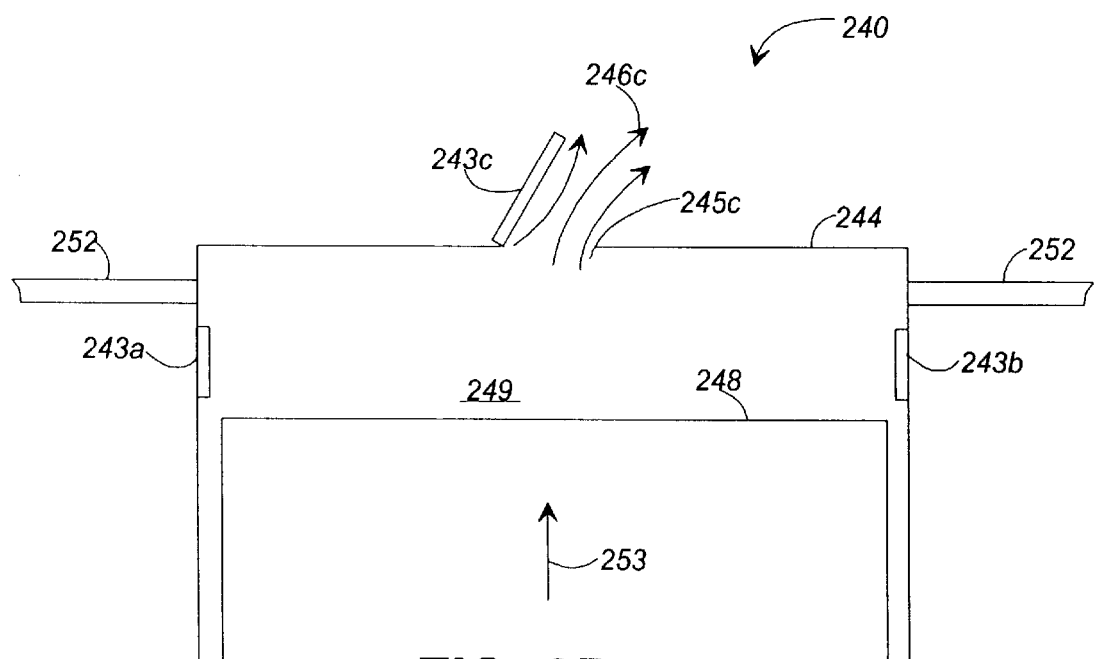
FIG. 8B is a schematic cross-sectional side view of the synthetic jet actuator of FIG. 8A illustrating the piston forcing fluid out of the actuator.

With reference to FIGS. 8A and 8B, a synthetic jet actuator 240 according to the invention may also operate as a pump transferring fluid from one side of a barrier 252 to the opposite side of the barrier 252. The jet actuator 240 comprises a housing 242 defining an interior chamber 249 and has a piston 248 reciprocating within the chamber 249. While the piston 248 is moving in direction 251, as shown in FIG. 8A, louvers 243a and 243b are open and permit fluid flows 246a and 246b to enter through openings 245a and 245b into the chamber 249. As the piston 248 moves in direction 253, the louvers 243a and 243b become closed and louver 243c opens, thereby permitting a fluid flow 246c to exit through opening 245c in wall 244. The reciprocation of the piston 248 within the actuator 240 therefore pumps fluid from one side of the barrier 252 to the opposite side of barrier 252.

C. Second Preferred Embodiment

Constant Suction Synthetic Jet Actuator

Figure 10:
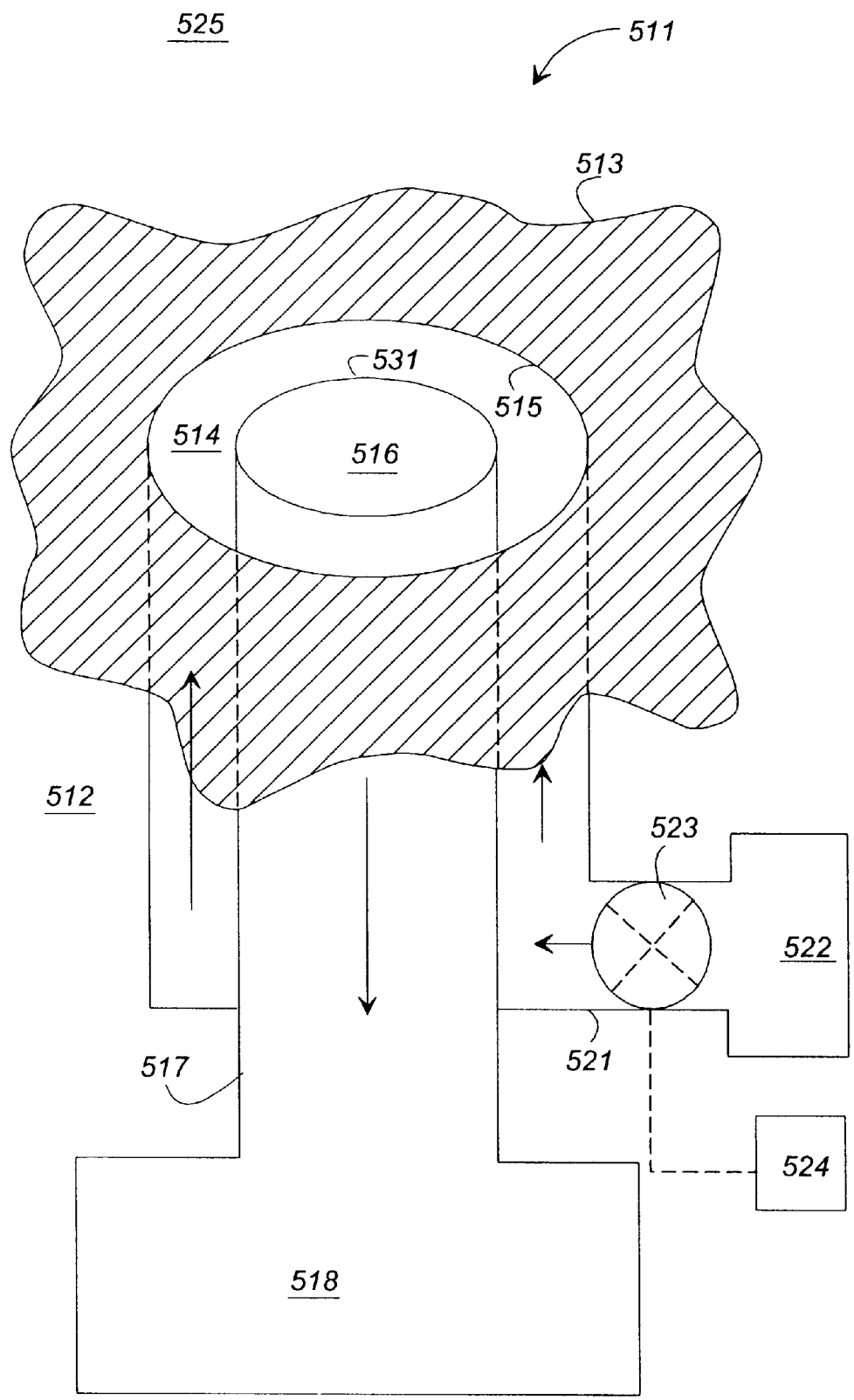
FIG. 10 is a cut-away perspective view of a second embodiment of a synthetic jet producing device.

The preferred embodiment for a constant suction synthetic jet actuator 511, a further improvement on the class of synthetic jet actuators, is depicted in FIG. 10. A constant suction synthetic jet 511 is particularly useful for the application of embedding a synthetic jet actuator into a solid body 512.

The preferred embodiment 511 is comprised of an outer cylindrical section 514 made similar to a pipe, and an inner cylindrical section 516. Although not limited to such an embodiment, the outer cylindrical section 514 and the inner cylindrical section 516 as depicted in FIG. 10 are concentric and approximately perpendicular to the outer surface 513 of the solid body 512. Additionally, the outer cylindrical section 514 is embedded into the solid body 512 such that an upper rim 515 of the outer section is contiguous with the outer surface 513. By contrast, the inner cylindrical section 516 has an upper rim 531 which is some small distance below the outer surface 513 of the solid body 512. The particular diameters given to the outer cylindrical section 514 and the inner cylindrical section 516 are not critical to the present invention.

The outer cylindrical section 514 should preferably be connected by fluidic piping 521 to a fluid source 522. Along the path of the fluidic piping 521 is a valve 523 which permits control of the fluid flow through the fluidic piping 521. The present invention, however, is not intended to be limited to the use of a valve 523 only. Any equivalent mechanism for stopping and restarting the flow of fluid would also function adequately and is included in the present invention.

In operation, the valve 523 should preferably alternately stop and then release fluid through the fluidic piping 521 and into the outer cylinder 514. This "on-off" operation is controlled by a suitable control system 524, such as a microcomputer or other logic device. The frequency at which the control system 524 causes the gate valve 523 to operate should preferably be adjustable in order to control effectively the operation of the synthetic jet actuator. A computer control system would easily provide this level of control.

The inner cylindrical section 516 is preferably connected by fluidic piping 517 to a suction mechanism 518. Such a suction mechanism 518 may comprise a vacuum, a pump, or any other appropriate mechanism for providing a constant suction. As indicated by the name of this preferred embodiment, the suction mechanism 518 operates constantly during operation of the synthetic jet actuator 511 and the removed fluid can be pumped back into the blowing section.

Figure 11A:
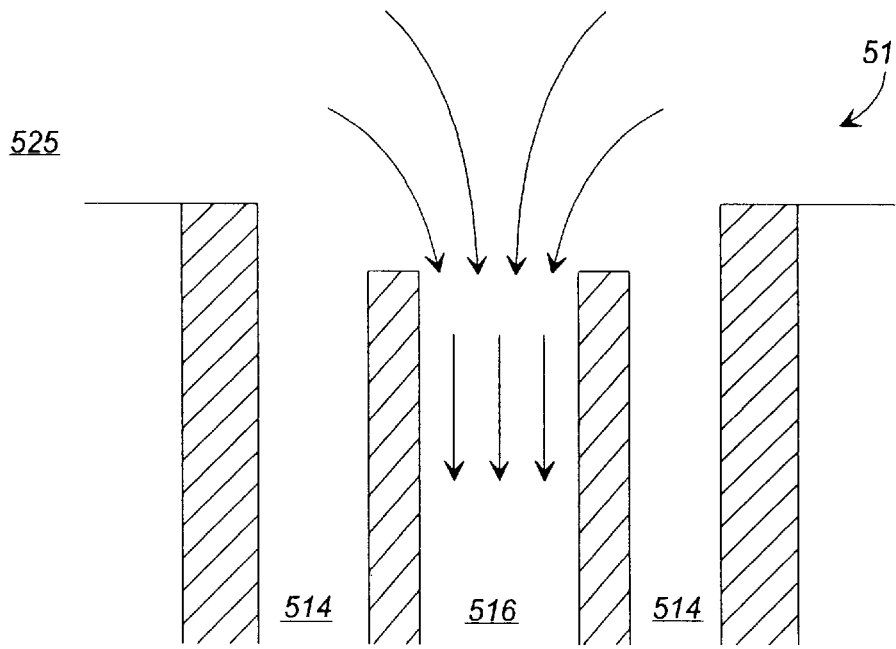
FIG. 11A is a schematic side-view of a second embodiment of a synthetic jet producing device in a first mode of operation where fluid is drawn in through the embodiment.

Therefore, in operation, the suction mechanism 518 creates a constant suction on an ambient fluid 524 above the outer surface 513 of the solid body 512. This action creates a constant flow of the ambient fluid 525 into the inner cylindrical section 516 and through the fluidic piping 517. The operation of the constant suction synthetic jet 511 when ambient fluid 525 is being pulled into the inner cylindrical section 516 is depicted in FIG. 11A. In FIG. 11A, the gate valve 523 is closed such that no fluid is ejected through the outer cylindrical section 514. This particular mode of operation is very much like the synthetic jet actuator 10 of FIGS. 1A–1C when the diaphragm or piston withdraws from the housing 11, thereby increasing the volume of the chamber 14.

Figure 11B:
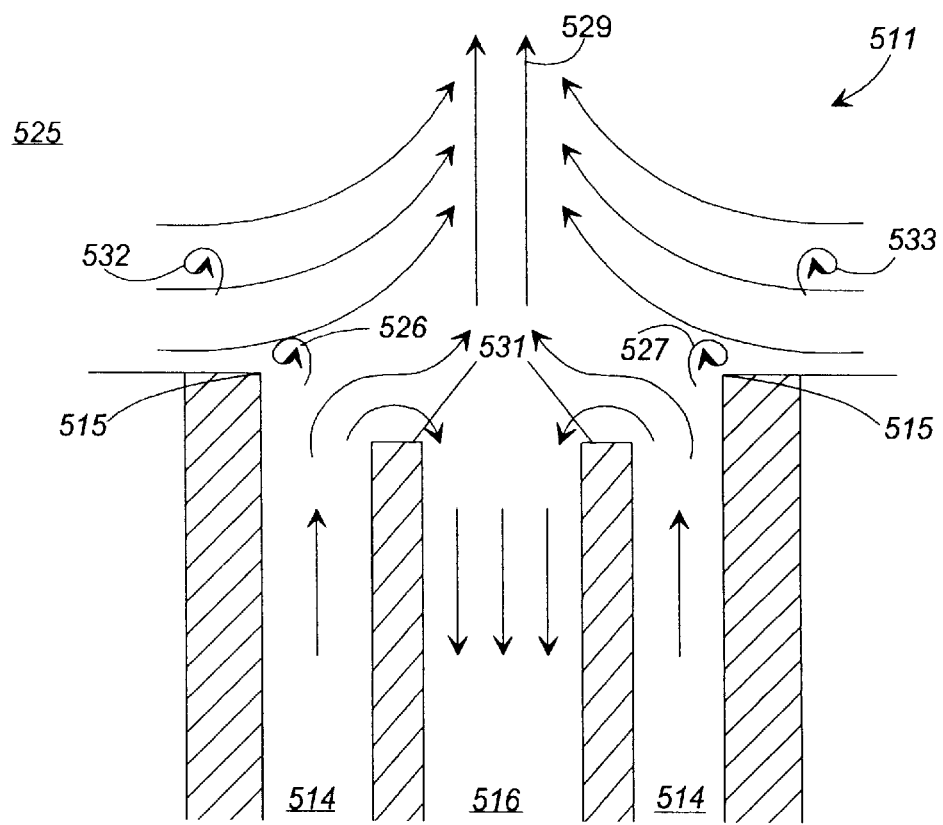
FIG. 11B is a schematic side-view of a second embodiment of a synthetic jet producing device in a second mode of operation which produces a synthetic jet stream.

FIG. 11B depicts a mode of operation of the constant suction synthetic jet 511 when the gate valve 523 is opened and fluid flows out through the outer cylindrical section 514. As the fluid goes by the upper rim 515 of the outer cylindrical section 514, vortices 526, 527 are formed, roll up, and move away. Vortices 532, 533, as depicted in FIG. 32B, have already moved a small distance away from the outer surface 513 of the body 512. The vortices 526, 527, 532, 533 entrain ambient fluid 525, as depicted by arrows 528a–528d. Thus, a synthetic jet actuator of fluid 529 is formed approximately normal to the outer surface 513 and moves away from the solid body 512.

Since the upper rim 531 of the inner cylindrical section 516 is slightly below the outer surface 513 of the solid body 512, as fluid is ejected from the outer cylindrical section 514, some of the fluid will be pulled around the upper rim 531 of the inner cylinder 516 and into the fluidic piping 517, as depicted in FIG. 11B. However, because this occurs below the outer surface 513 of the solid body 512, the formation of the vortices 526, 527 and the resulting fluid jet 529 is not affected by the constant suction.

The constant suction synthetic jet actuator 511 alternates between the mode of operation depicted in FIG. 11A and the mode of operation depicted in FIG. 11B. However, as descried above with regard to the synthetic jet actuator 10 depicted in FIGS. 1A–1C, a constant jet of fluid 529 is formed above the opening in the outer surface 513 of the solid body 512.

If it is desired, the fluid source 522 for the outer cylindrical section 514 can be a storage container into which fluid from the ambient air 525 is deposited after being drawn through the inner cylinder 516 by the suction mechanism 518. In this way, zero net mass is injected into the system. This feature may be desirable in some applications. However, the present invention is not limited to such a configuration. Where it does not matter whether any mass is ejected into the system, the source of fluid 522 for the outer cylinder 514 can be any fluidic chamber or environment. In this way, the net mass flow into or out of the synthetic jet actuator of this preferred embodiment can be tailored for the specific application.

II. Mixing Applications of Synthetic Jet Actuators

The devices capable of forming synthetic jets, as described above, have certain novel applications as improved mixing devices. The present invention involves these mixing devices, which are described in details as follows:

A. Mixing a Free Flow with an Ambient Fluid

Figure 2:
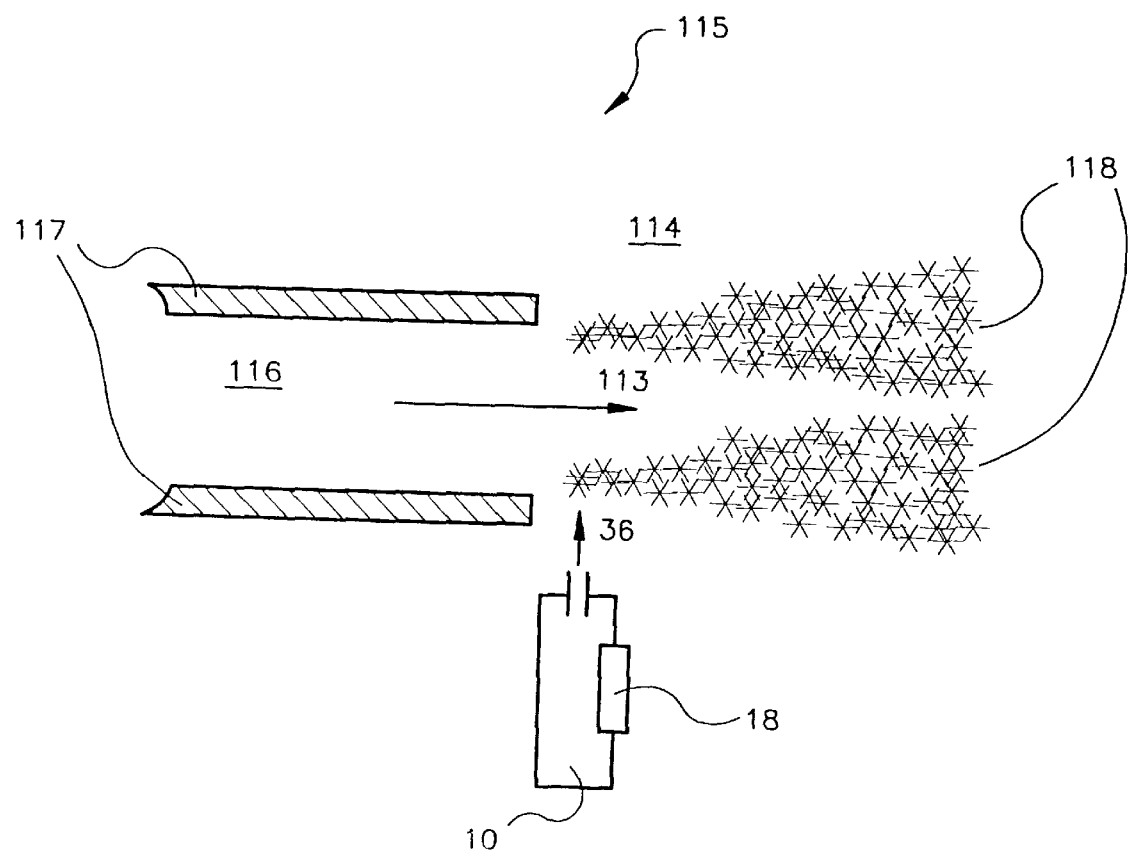
FIG. 2 is a schematic cross-sectional side view of a synthetic jet actuator mounted transverse to a primary jet to directly excite high frequency dissipative motions.

The preferred embodiment for using a synthetic jet actuator 10 to mix a primary jet of fluid 113 with ambient fluid 114 through direct small scale vorticity manipulation is pictured in FIG. 2, denoted by reference numeral 115. Although any means of high frequency excitation would yield similar results, use of a synthetic jet actuator 10 is depicted here. The synthetic jet actuator exhibits several inherent advantages over other mechanisms causing high frequency excitation. For example, a synthetic jet actuator is non-intrusive and causes no net mass change in the system.

It should be noted, however, that high frequency excitation can be affected by a number of actuators including fluidic actuators, synthetic jets, or piezoelectric actuators where the scale of the perturbations induced by the actuator is adjusted to be within the dissipation range of the flow. Conventional pulsed jets, moving flaps, and electromechanical actuators (such as speakers) can also be used to introduce the high frequency, high amplitude disturbances required locally. Ultrasonic devices can introduce even higher frequencies. Magnethohydrodynamic actuation can be used to nonintrusively introduce dissipative motions globally throughout the flow. It should be noted that with any of these techniques, it is possible to operate at the Kolmogorov scale, the Batchelor scale, or even smaller.

In the preferred embodiment shown in FIG. 2, a square primary jet 116 is shown with a synthetic jet actuator 10 situated such that the flow direction of the jet actuator 10 (depicted by arrow 36) is perpendicular to the flow direction (depicted by arrow 113) of the primary jet 116. As the primary jet flow 113 passes out of the primary jet housing 117, a shear layer 118 is formed between the high speed jet fluid 113 and the ambient fluid 114. The hierarchy of vortical structures is formed within the shear layer between the jet and the ambient fluid. The synthetic jet actuator 10 is then activated and operated by vibration of the synthetic jet actuator diaphragm 18 at a very high frequency. Such high frequency excitation increases the dissipation of the primary jet turbulent energy and scalar mixing at a faster rate than if no synthetic jet actuator 10 were used.

It is also possible to effectively mix a fluid flow with an ambient fluid by a "parallel arrangement." That is, the synthetic jet actuator may be positioned such that the synthetic jet stream and the primary jet stream are parallel. The synthetic jet actuator, in such a configuration, is attached to a housing wall of a primary jet actuator. An orifice of the synthetic jet actuator is placed in the exhaust plane of the primary jet actuator. When both are operated at the same time, effective, controllable mixing will occur.

In addition, mixing may be accomplished with a synthetic jet actuator of the first preferred embodiment having louvers or a synthetic jet actuator of the second preferred embodiment, the concentric cylinder configuration. The present invention is not limited by the particular configuration of the synthetic jet actuator.

B. Mixing Fluids in a Bounded Volume

Figure 3:
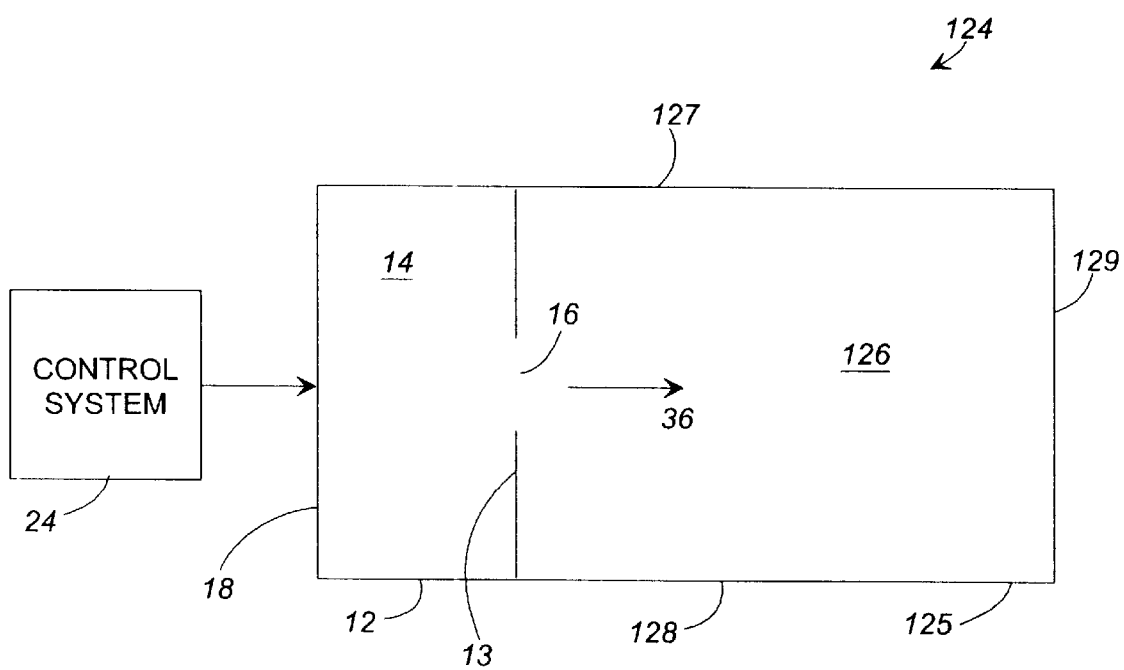
FIG. 3 is a schematic cross-sectional side view of a synthetic jet mixing system having the synthetic jet actuator of FIG. 1A and employed within a bounded volume.

The preferred embodiment of a closed volume mixing apparatus 124 is pictured in FIG. 3. The mixing apparatus 124 comprises a rectangularly cubic housing 125 defining a sealed chamber 126. The chamber 126 is defined in the two-dimensional depiction of FIG. 3 by a lower housing wall 128, an upper housing wall 127, and a right housing wall 129. The final end of the mixing apparatus chamber 126 is comprised of the front wall 13 of a synthetic jet actuator 10 (as depicted in FIG. 1A) with the orifice 16 of the actuator 10 facing the inside the mixing apparatus chamber 126. One wall of the synthetic jet actuator housing 12 comprises a flexible material comprising a diaphragm 18. The diaphragm 18 is caused to vibrate at a high frequency by a control system 24. When the diaphragm 18 is excited by the control system 24, a synthetic jet stream 36 is produced in the chamber 126 originating in the region around the orifice 16 in the synthetic jet actuator housing 12 and propagating in a direction away from the housing wall constituting the diaphragm 18. The vortices within this turbulent flow 36, aid the mixing of fluid in the chamber 126.

As with mixing of free fluid flows, described above, the preferred embodiment of a bounded volume mixing apparatus may incorporate other embodiments of synthetic jet actuators without departing from the principles of the present invention. Particularly, bounded volume mixing may be accomplished with a synthetic jet actuator of the first preferred embodiment having louvers or a synthetic jet actuator of the second preferred embodiment, the concentric cylinder configuration. The present invention is not limited by the particular configuration of the synthetic jet actuator.

C. Louvered Mixing Apparatus

Figure 6A:
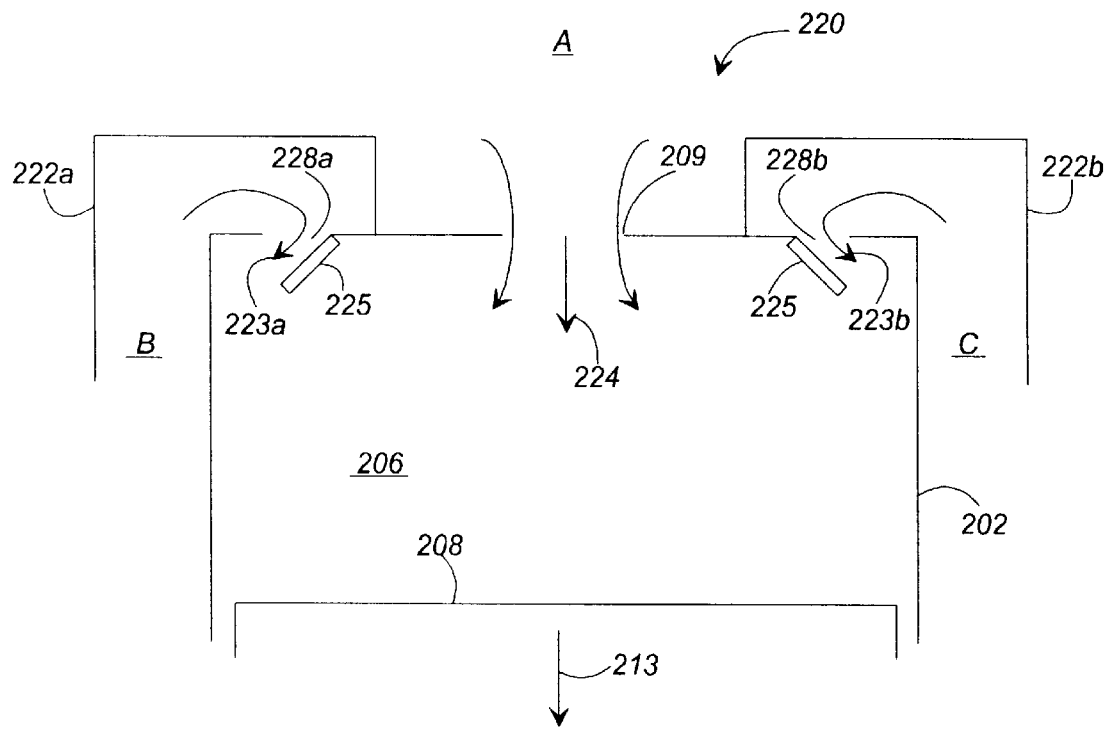
FIG. 6A is a schematic cross-sectional side view of a synthetic jet actuator used to mix at least two different fluids and illustrates a piston of the actuator drawing fluid into the actuator.
Figure 6B:
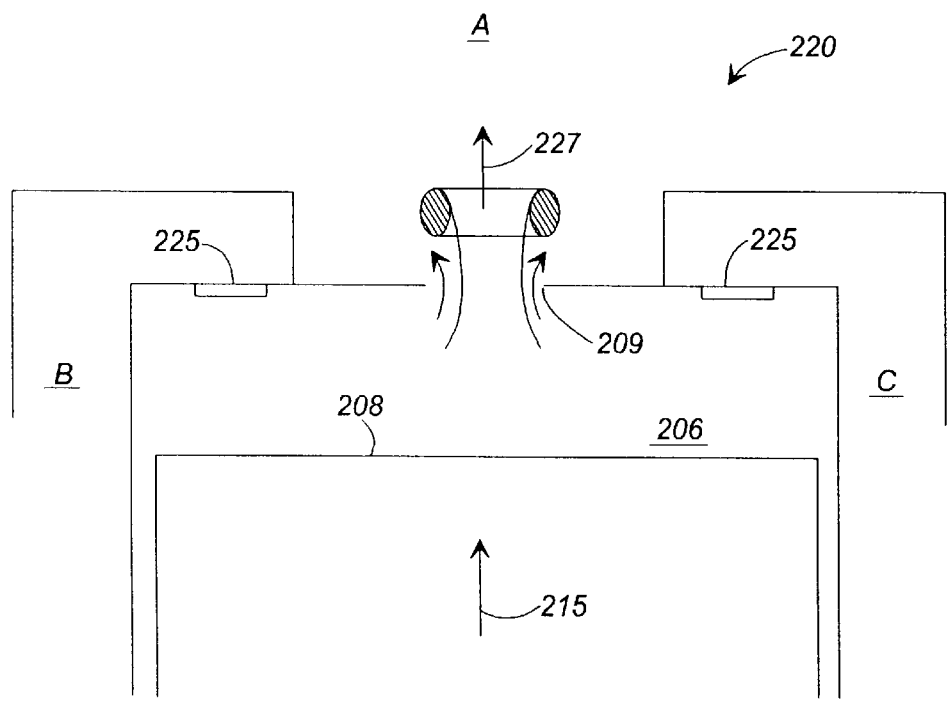
FIG. 6B is a schematic cross-sectional side view of the synthetic jet actuator of FIG. 6A illustrating the piston forcing a mixture of fluids out of the actuator.

In addition to the potential use of a louvered synthetic jet actuator in the mixing embodiments described above, FIGS. 6A–6B illustrate the preferred embodiment of a synthetic jet actuator 220 operating as a mixing apparatus. The synthetic jet 220, as with jets 200 and 200', comprise a piston 208 that reciprocates in directions 213 and 215 in order to alternately force fluid into and out of chamber 206. While the piston 208 moves in direction 213, louvers 225 open and permit fluid from region B to travel through passage 222a and enter into the chamber 206 as a flow 223a and for fluid from region C to travel through passage 223b and enter into the chamber 206 as a flow 223b. Also at this time, a fluid flow 224 from region A is drawn in through the orifice 209 into the chamber 206 and becomes mixed with the fluid flows 223a and 223b from regions B and C, respectively. While the piston 208 moves in direction 215, the louvers 225 are closed and fluid in chamber 206 is forced out of the orifice 209 in a flow 227. The flow 227 is a fairly strong flow and is defined by vortices which further promote mixing of the fluids from regions A, B, and C.

With the synthetic jet actuator 220, the fluids from regions B and C may be the same fluid and, furthermore, may be different than the fluid within region A. Thus, during operation, the jet actuator 220 will receive fluid flows 224, 223a, 223b from regions A, B, and C, respectively, and mix these fluids within the chamber 206. The invention, however, is not limited to having only two different types of fluids and may have a greater number of different fluids flowing through individual passages into the chamber 206. Alternatively, the fluids from regions B and C may be the same type of fluid and will be mixed together with the fluid in region A.

In addition to varying the number of different types of fluids, the jet actuator 220 may also vary the flow rates from the various regions. For instance, in the example shown in FIGS. 6A and 6B, the surface areas of openings 228a and 228b can be adjusted relative to each other and relative to the surface area of the orifice 209 in order to selectively control the rates of fluid flows 223a, 223b, and 224. Because the flow rates can be adjusted, the jet actuator 220 can produce mixtures of fluids having a range of concentrations. For example, by increasing the surface area of opening 228 relative to opening 228b, the mixture within the chamber 206 will have a larger amount of fluid, and thus a higher concentration, of fluid from region B than from region C. The synthetic jet actuator 220 would be ideal for applications, such as an automotive fuel injector, where two or more fluids need to be accurately mixed.

Figure 9:
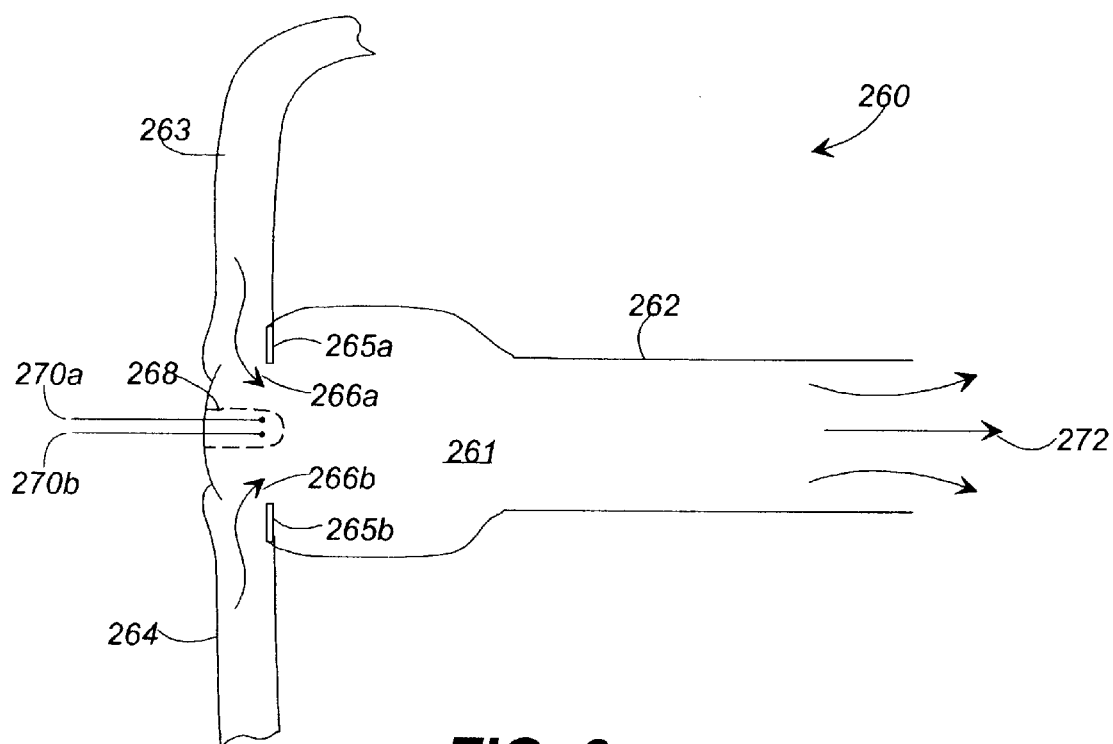
FIG. 9 is a schematic cross-sectional side view of a micromachined jet having at least one louver for introducing combustible fuel into a chamber.

The louvers according to the invention are not limited to use solely within a synthetic jet actuator but may be embodied in other types of jets or apparatuses. For instance, as shown in FIG. 9, a jet apparatus 260 comprises a housing 262 defining an interior chamber 261. The chamber 261 initially contains an oxidizer, such as ambient air, which is subsequently mixed with a combustible fuel, such as gasoline. The fuel is added to the chamber 261 by opening louvers 265a and 265b to permit the fuel to flow through passages 263 and 264 and through openings 266a and 266b. Once the fuel is added to the chamber 261, the louvers 265a and 265b are closed and a spark plug 268 introduces a spark into the chamber 261 between its pair of contacts 270a and 270b. The spark combusts the fuel and, due to the increase in volume of fluid within the chamber 261, causes a jet flow 272 to exit the chamber 262. Rather than having two passages 263 and 264 for the introduction of fuel into the chamber 261, the jet actuator 260 may only have one passage or, alternatively, may have one of these passages 263 or 264 introduce the oxidizing agent. Other variations in the design of the jet actuator should be apparent to those skilled in the art.

It would be apparent to one skilled in the art that many variations and modifications may be made to the preferred embodiment as described above without substantially departing from the principles of the present invention. All such variations and modifications are intended to be included herein and are within the scope of the present invention, as set forth in the following claims.

What is claimed is:

1. A system for mixing a primary jet stream of a first fluid with an ambient fluid, comprising:
   (a) a means for generating a primary jet stream;
   (b) an excitation means for directly introducing high frequency perturbations of said ambient fluid into said primary jet stream of said fluid; and
   (c) said primary jet stream of said first fluid contacting said perturbations, said mixing of said primary jet stream and said ambient fluid being modified by said perturbations.

2. The system of claim 1, wherein said excitation means comprises a synthetic jet actuator for emitting vortices, wherein said vortices entrain said ambient fluid local to said vortices, thereby generating a synthetic jet stream, said synthetic jet stream transverse to said primary jet stream.

3. The system of claim 2, wherein said synthetic jet actuator comprises:
   (a) a jet housing defined by walls, said jet housing having an internal chamber with a volume of said ambient fluid and an opening in said jet housing connecting said chamber to said ambient fluid; and
   (b) a volume changing means for periodically changing said volume within said internal chamber so that a series of fluid vortices are generated and projected in said ambient fluid out from said opening of said jet housing.

4. A method for mixing a primary jet stream of primary fluid with an ambient fluid, comprising the steps of:
   providing said primary jet stream;
   generating a synthetic jet stream, said synthetic jet stream comprising a series of fluid vortices entraining said ambient fluid;
   emitting said synthetic jet stream in a direction transverse to said primary jet stream; and
   mixing said primary jet stream with said ambient fluid by contacting said primary jet stream with said synthetic jet stream.

5. A system for mixing a primary jet stream of fluid with an ambient fluid, comprising:
   a synthetic jet actuator for emitting a synthetic jet stream transverse to said primary jet stream, said synthetic jet actuator directly introducing high frequency perturbations into said primary jet stream; and
   said primary jet stream of fluid contacting said high frequency perturbations, said mixing of said primary jet stream and said ambient fluid being modified by said high frequency perturbations;
   wherein, said synthetic jet actuator comprises:
   (a) a jet housing defined by walls, said jet housing having an internal chamber with a volume of said ambient fluid and an opening in said jet housing connecting said internal chamber to an external environment; and
   (b) a volume changing means for periodically changing said volume of ambient fluid within said internal chamber so that a series of fluid vortices are generated and projected in said external environment out from said opening of said jet housing.

6. A system for mixing a primary jet stream of a first fluid with a second fluid, comprising:
   (a) a means for generating a primary jet stream;
   (b) an excitation means for directly introducing high frequency perturbations into said primary jet stream; and
   (c) said primary jet stream contacting said perturbations, said mixing of said primary jet stream and said second fluid being modified by said excitation means.

7. The system of claim 6, wherein said excitation means comprises a synthetic jet actuator for generating a synthetic jet stream transverse to said primary jet stream.

8. The system of claim 7, wherein said synthetic jet actuator comprises:
   (a) a jet housing defined by walls, said jet housing having an internal chamber with a volume of said second fluid and an opening in said jet housing connecting said chamber to an external environment; and
   (b) a volume changing means for periodically changing said volume within said internal chamber so that a series of fluid vortices are generated and projected in said external environment out from said opening of said jet housing.

9. A method of mixing a primary jet stream of a primary fluid with an ambient fluid comprising the steps of:
   providing said primary jet stream;
   generating high frequency perturbations;
   emitting said high frequency perturbations in a direction transverse to said primary jet stream; and
   mixing said primary jet stream of said primary fluid with said ambient fluid by contacting said primary jet stream with said perturbations.

10. A method of mixing a primary jet stream of a primary fluid with an ambient fluid, comprising the steps of:
   providing said primary jet stream;
   generating high frequency perturbations, said perturbations comprising said ambient fluid;
   emitting said high frequency perturbations in a direction transverse to said primary jet stream; and
   mixing said primary jet stream of fluid in said phase with said ambient fluid in said phase by contacting said primary jet stream with said perturbations.

* * * * *